US009854696B1

(12) United States Patent
Lin et al.

(10) Patent No.: US 9,854,696 B1
(45) Date of Patent: Dec. 26, 2017

(54) SERVER HAVING LIGHT-EMITTING COVER

(71) Applicant: Super Micro Computer Inc., San Jose, CA (US)

(72) Inventors: Jenglung Lin, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/357,572

(22) Filed: Nov. 21, 2016

(51) Int. Cl.
| F21V 33/00 | (2006.01) |
| H05K 7/14 | (2006.01) |
| F21V 19/00 | (2006.01) |
| F21V 8/00 | (2006.01) |
| F21V 23/06 | (2006.01) |
| F21Y 115/10 | (2016.01) |

(52) U.S. Cl.
CPC ......... H05K 7/1487 (2013.01); F21V 19/003 (2013.01); F21V 23/06 (2013.01); F21V 33/0052 (2013.01); G02B 6/0095 (2013.01); H05K 7/1452 (2013.01); F21Y 2115/10 (2016.08)

(58) Field of Classification Search
None
See application file for complete search history.

(56) References Cited

U.S. PATENT DOCUMENTS

| 5,128,830 A * | 7/1992 | Deluca | H01R 13/6315 361/679.02 |
| 2006/0003632 A1* | 1/2006 | Long | H01R 13/65802 439/607.2 |
| 2013/0027863 A1* | 1/2013 | Tsai | H01R 13/5213 361/679.4 |
| 2017/0149158 A1* | 5/2017 | Park | H01R 13/2421 |

* cited by examiner

Primary Examiner — Ashok Patel
(74) Attorney, Agent, or Firm — Chun-Ming Shih; HDLS IPR Services

(57) ABSTRACT

A server having a light-emitting cover includes a frame, a cover assembly and at least one pogo pin connector. The frame includes an opening and at least one recess adjacent to the opening. The recess includes an electrical contact inside. The cover assembly includes a cover plate and a light emitting module fixed to the cover plate. The cover plate covers the opening. The pogo pin connector is installed on the cover plate and is electrically connected to the light-emitting module. The pogo pin connector is detachably engaged in the recess and is in contact with the electrical contact. Accordingly, the cover assembly provides a light indication, provides an attractive appearance, and can be detached or assembled easily.

10 Claims, 7 Drawing Sheets

SERVER HAVING LIGHT-EMITTING COVER

TECHNICAL FIELD

The present invention relates to a server structure and, in particular, to a server having a light-emitting cover.

BACKGROUND

An industrial server is mainly used in a high-traffic website, an independent mail server system, a large database management system, or enterprise data processing. A conventional industrial server includes a frame, a motherboard, a central processing unit and a plurality of hard disks. One side of the frame has a plurality of openings, the motherboard and the central processing unit are installed inside the frame, each of the hard disks is inserted in each of the openings and is electrically connected to the motherboard and the central processing unit, and thereby a server with excellent computing ability is constructed.

The openings of the server are normally directly exposed so as to facilitate installation and removal of the hard disks. However, the directly exposed openings result in dust accumulation, inadvertent touches on the hard disk, or other problems. To improve the structures of the industrial servers, it is important to design a cover plate which is installed on the opening and serves to protect the hard disk, provide an attractive appearance and facilitate usage.

Accordingly, it is the aim of the present invention to solve the above-mentioned problems, on the basis of which the present invention is accomplished.

SUMMARY

The present invention provides a server having a light-emitting cover. By using a pogo pin connector detachably engaged in a recess and disposed in contact with an electrical contact, a cover assembly can provide a luminous indication, provide an attractive appearance and facilitate assembly and disassembly.

A server having a light-emitting cover is provided according to one embodiment of the present invention, which includes: a frame, the frame including an opening and at least one recess adjacent to the opening, the recess including an electrical contact inside; a cover assembly, the cover assembly including a cover plate and a light-emitting module fixed to the cover plate, the cover plate covering the opening; and at least one pogo pin connector installed on the cover plate and electrically connected to the light-emitting module, the pogo pin connector being detachably engaged in the recess and being in contact with the electrical contact.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 7, the present invention provides a server having a light-emitting cover. The server 10 mainly includes a frame 1, a cover assembly 2 and one or multiple pogo pin connectors 3.

Figure 1:
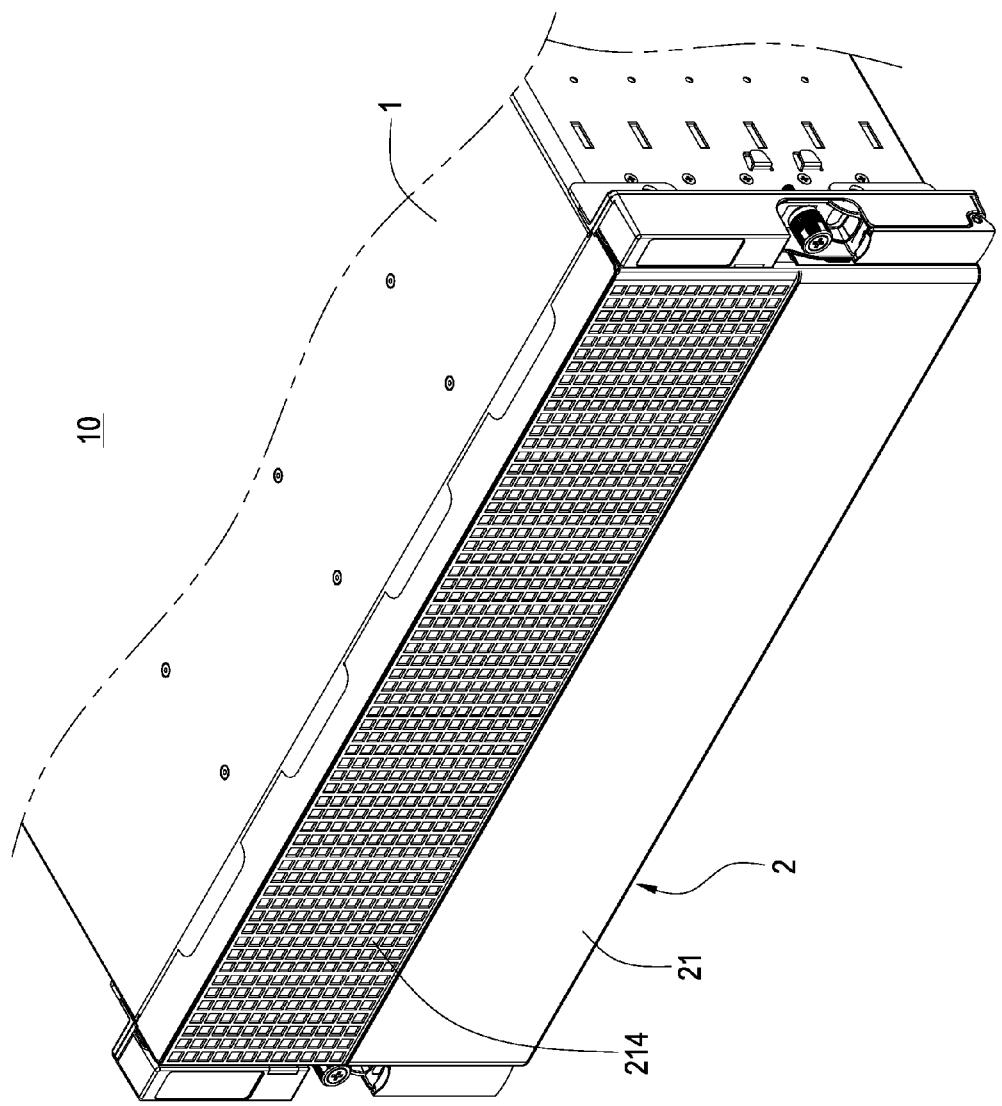
FIG. 1 is perspective assembled view illustrating a server according to the present invention.
Figure 2:
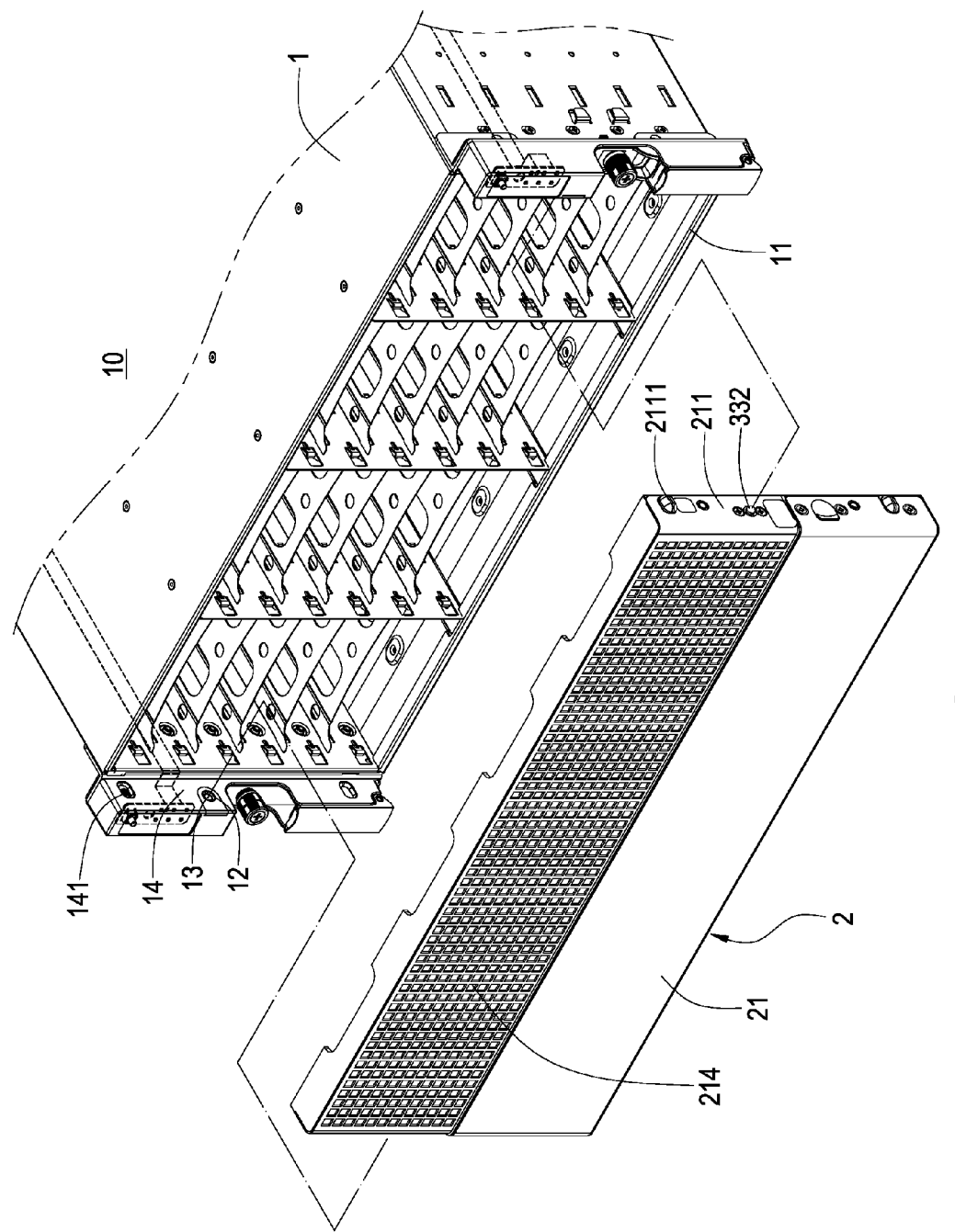
FIG. 2 is a perspective exploded view illustrating the server according to the present invention.
Figure 3:
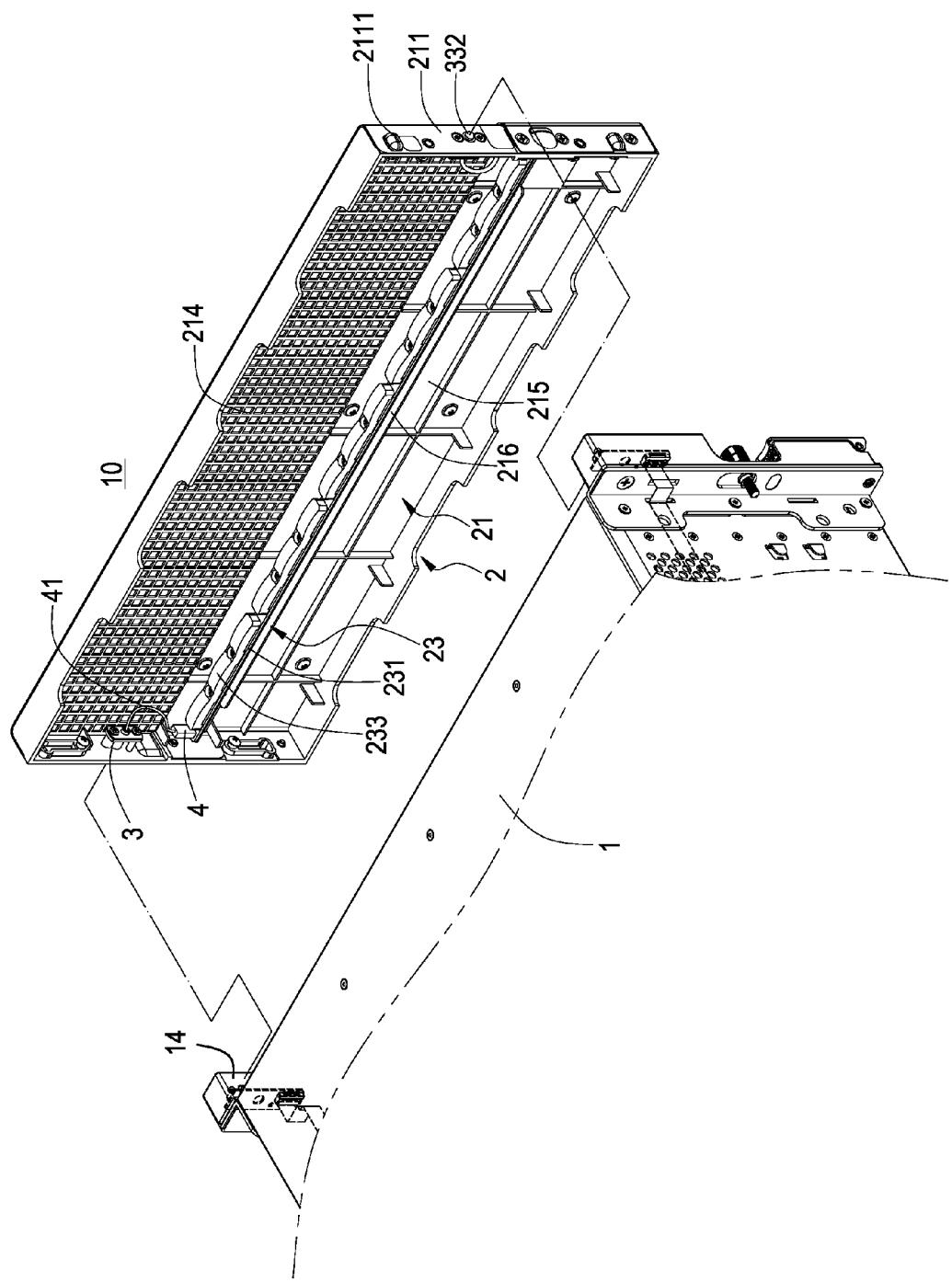
FIG. 3 is another perspective exploded view illustrating the server according to the present invention.
Figure 4:
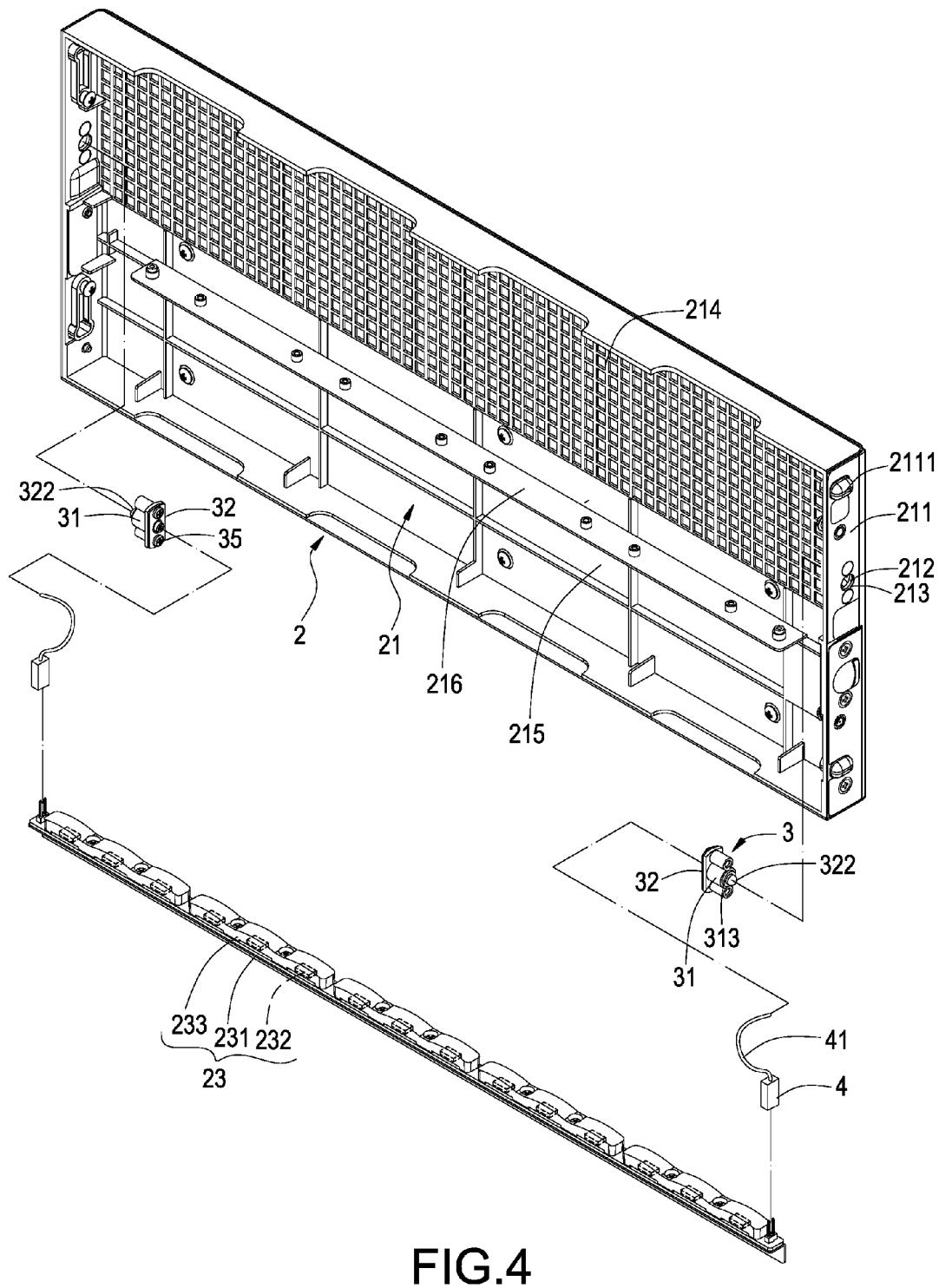
FIG. 4 is still another perspective exploded view illustrating the server according to the present invention.
Figure 5:
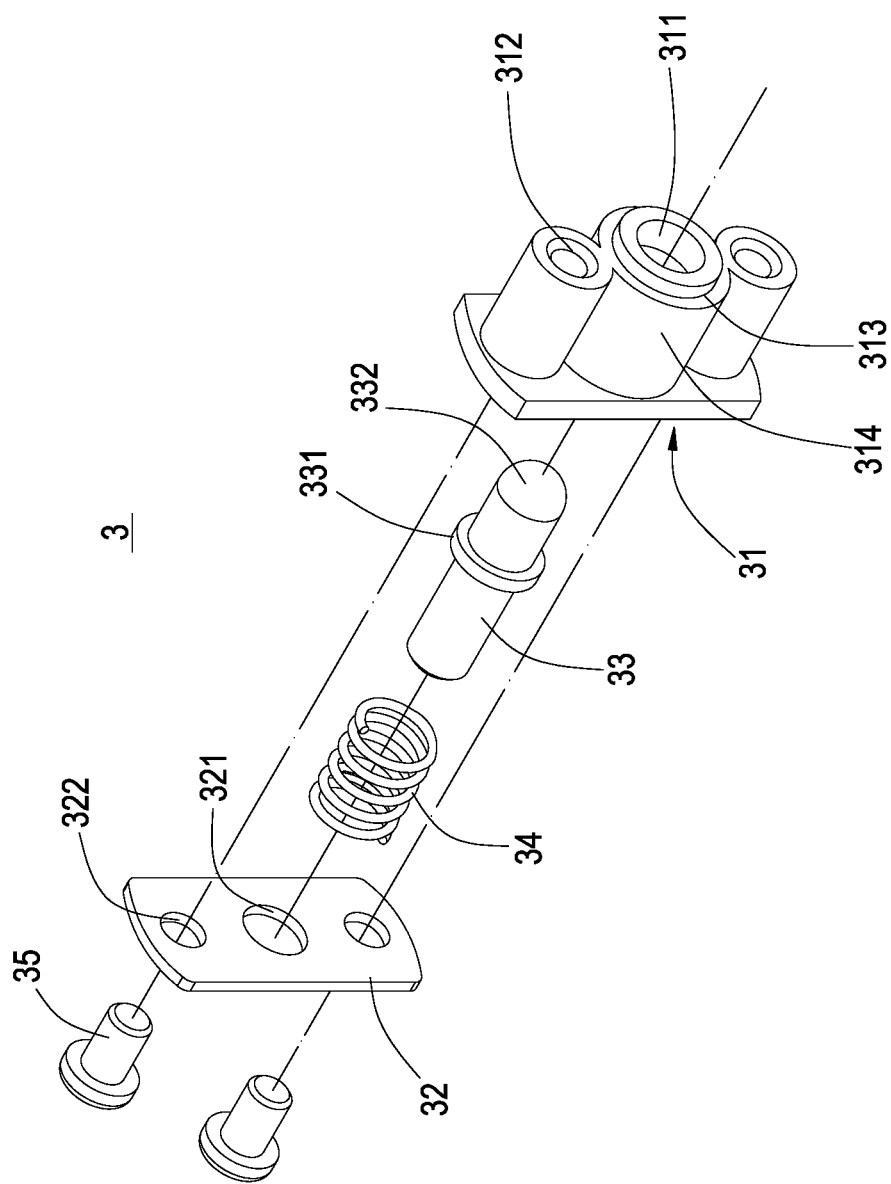
FIG. 5 is a perspective exploded view illustrating a pogo pin connector according to the present invention.

Referring to FIGS. 1 to 3, the frame 1 includes an opening 11 and one or multiple recesses 12 adjacent to the opening 11. The recess 12 includes an electrical contact 13 inside. The electrical contact 13 is disposed on a bottom 121 of the recess 12.

To be specific, in the present embodiment, the server 10 includes two recesses 12, the frame 1 includes two inner side walls 14 disposed at two sides of the opening 11, each of the recesses 12 is formed on each of the inner side walls 14, and each of the inner side walls 14 includes a plurality of engagement slots 141.

As shown in FIGS. 1 to 4, the cover assembly 2 includes a cover plate 21 and a light-emitting module 23 fixed to the cover plate 21, and the cover plate 21 covers the opening 11. In detail, the cover plate 21 has two outer side walls 211 opposite to each other, each of the outer side walls 211 includes a through slot 212, a protruding portion 213 extends from an inner wall surface of each of the through slots 212, each of the outer side walls 211 includes a plurality of protruding points 2111, each of the protruding points 2111 is detachably engaged with each of the engagement slots 141, so that the cover plate 21 can be securely assembled between the two inner side walls 14.

Furthermore, the cover plate 21 includes a plurality of apertures 214 and an inner surface 215, a perpendicular plate 216 extends from the inner surface 215, and the perpendicular plate 216 is disposed adjacent to the apertures 214.

Moreover, the light-emitting module 23 includes a circuit board 231, a plurality of light-emitting diodes 232, and a light guide cover 233. The circuit board 231 is fixed to the perpendicular plate 216, the light-emitting diodes 232 are installed on the circuit board 231, and the light guide cover 233 covers the light-emitting diodes 232.

Referring to FIGS. 4 to 7, the pogo pin connector 3 is installed on the cover plate 21 and is electrically connected to the light-emitting module 23. The pogo pin connector 3 is detachably engaged in the recess 12 and is in contact with the electrical contact 13. In the present embodiment, the server 10 includes two pogo pin connectors 3, and each of the pogo pin connectors 3 is installed on each of the outer side walls 211.

Further, the pogo pin connector 3 includes a sleeve base 31, a board 32, an axle pin 33, a spring 34, and a plurality of fastening rods 35. Each of the sleeve bases 31 is connected to the cover plate 21, each of the sleeve bases 31 includes a first through hole 311 and a plurality of first fastening holes 312, each of the boards 32 includes a second through holes 321 and a plurality of second fastening holes 322, one end of the axle pin 33 is inserted through the first through hole 311, the other end of the axle pin 33 is inserted through the second through hole 321, the axle pin 33 includes an annular block 331 protruding therefrom and includes a conical end 332 exposed from the first through hole 311, each spring 34 is clamped between the annular block 331 and the board 32, and each of the fastening rods 35 is inserted through each of the first fastening holes 312 and each of the second fastening holes 322.

Moreover, a distal end of each of the sleeve bases 31 includes a depression portion 313, each of the protruding portions 213 is engaged with each of the depression portions 313, each of the sleeve bases 31 is securely positioned in each of the through slots 212, a hollow tube 314 extends from each of the sleeve bases 31, each of the first through holes 311 is formed along a central axis of each of the hollow tubes 314, and each of the depression portions 313 is formed on a distal end of the hollow tube 314.

Referring to FIGS. 4 to 7, the server 10 of the present invention further includes one or more electrical connectors 4, the number of the electrical connectors 4 is equal to the number of the pogo pin connectors 3. One end of the electrical connector 4 is electrically connected to the axle pin 33 through a wire 41, and the other end of the electrical connector 4 is electrically connected to the circuit board 231.

Referring to FIGS. 4 to 7, the server 10 of the present invention is so constructed that the frame 1 includes an opening 11 and one or more recesses 12 adjacent to the opening 11, the recess 12 includes an electrical contact 13 inside, the cover assembly 2 includes a cover plate 21 and a light-emitting module 23 fixed to the cover plate 21, the cover plate 21 covers the opening 11, the pogo pin connector 3 is installed on the cover plate 21 and is electrically connected to the light-emitting module 23, and the pogo pin connector 3 is detachably engaged in the recess 12 and is in contact with the electrical contact 13.

Figure 6:
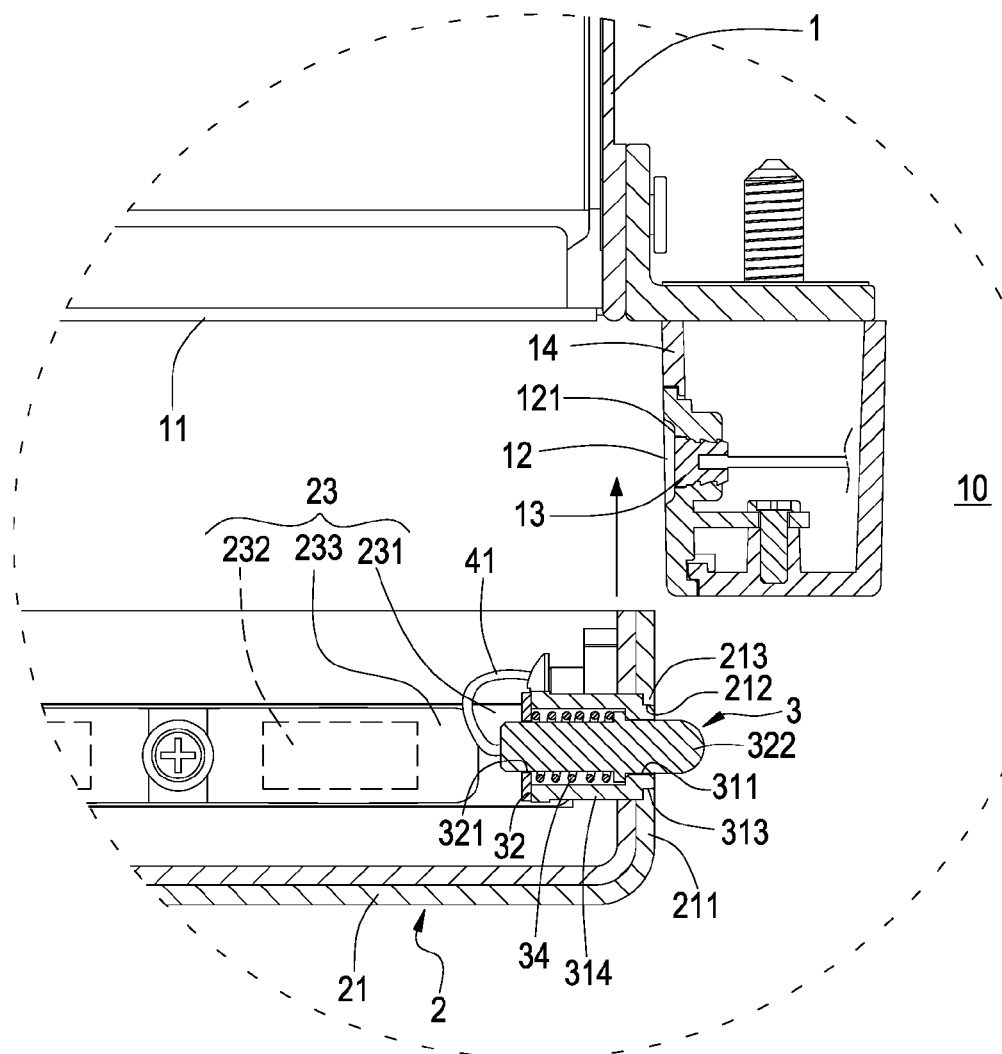
FIG. 6 is a schematic view illustrating the server in use.
Figure 7:
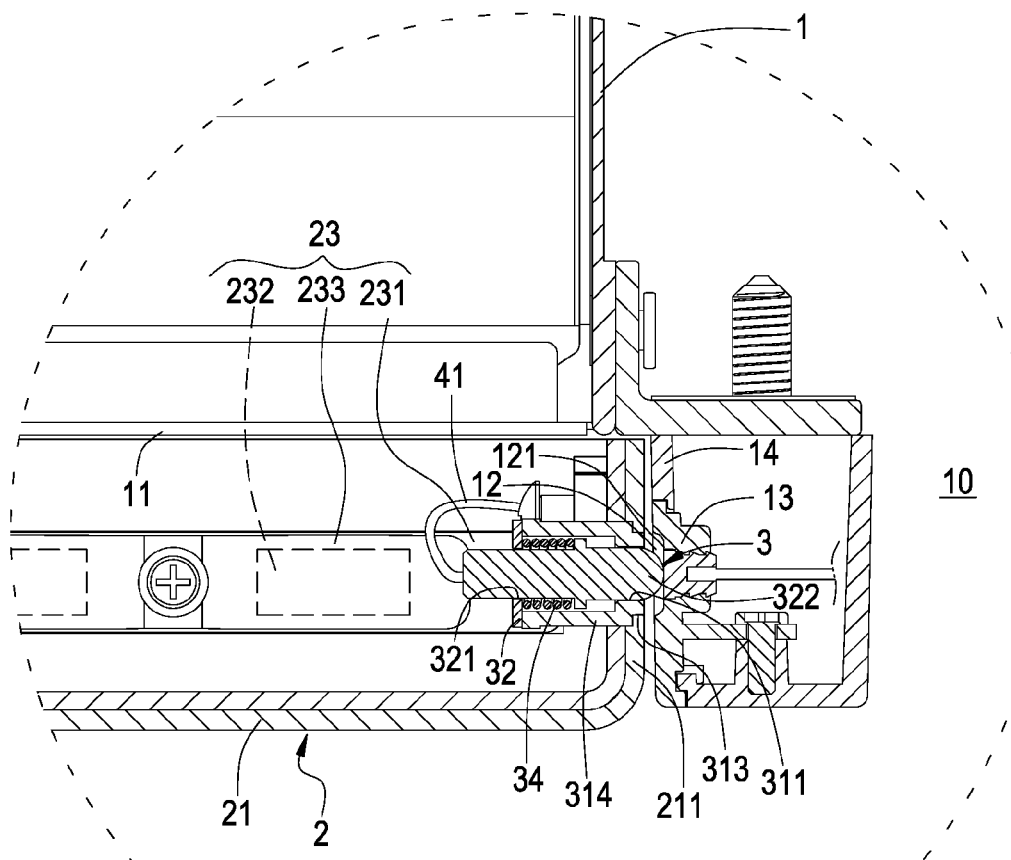
FIG. 7 is another schematic view illustrating the server in use.

Referring to FIGS. 6 and 7 illustrating the server 10 in use, when the cover plate 21 is assembled between the two inner side walls 14, the spring 34 is compressed or stretched to drive the axle pin 33 to retract inwardly or protrude out with respect to the cover plate 21. As a result, the conical end 332 is brought into engagement in the recess 12 to contact the electrical contact 13, and the electrical contact 13 is electrically connected to the axle pin 33, the wire 41, the electrical connector 4, and the circuit board 231 in sequence, thereby driving the light emitting diodes 232 to emit light.

Furthermore, since the cover plate 21 covers the opening 11, components inside the server 10, like a hard disk, a motherboard and a central processing unit, are prevented from dust accumulation or being dismantled easily. The axle pin 33 retracts or protrudes by the action of the spring 34, so by a gentle push, the cover plate 21 can be assembled to the frame 1, and by a gentle pull, the cover plate 21 can be detached from the frame 1. Therefore, the cover assembly 2 can protect the components inside the server 10 and allow for easy assembly and disassembly.

In addition, by observing the light emitting diodes 232 emit light from the apertures 214, a user may know that the server 10 operates normally and the electrical power is normal. Therefore, the cover assembly 2 provides a light indication of normal electrical power and normal operation of the server 10, and provides an attractive appearance.

In summary, the server having the light-emitting cover of the present invention certainly can achieve anticipated objectives and solve the conventional defects. The present invention also has industrial applicability, novelty and non-obviousness, so the present invention completely complies with the requirements of patentability. Therefore, a request to patent the present invention is filed pursuant to patent law. Examination is kindly requested, and allowance of the present application is solicited to protect the rights of the inventor.

What is claimed is:

1. A server having a light-emitting cover, comprising:
   a frame, the frame including an opening and at least one recess adjacent to the opening, the recess including an electrical contact inside;
   a cover assembly, the cover assembly including a cover plate and a light-emitting module fixed to the cover plate, the cover plate covering the opening; and
   at least one pogo pin connector installed on the cover plate and electrically connected to the light-emitting module, the pogo pin connector being detachably engaged in the recess and being in contact with the electrical contact.

2. The server having the light-emitting cover of claim 1, wherein the pogo pin connector includes a sleeve base, a board, an axle pin, a spring, and a plurality of fastening rods, the sleeve base is connected to the cover plate, the sleeve base includes a first through hole and a plurality of first fastening holes, the board includes a second through hole and a plurality of second fastening holes, one end of the axle pin is inserted through the first through hole, the other end of the axle pin is inserted through the second through hole, the axle pin includes an annular block protruding therefrom and includes a conical end exposed from the first through hole, the spring is clamped between the annular block and the board, and each of the fastening rods is inserted through each of the first fastening holes and each of the second fastening holes.

3. The server having the light-emitting cover of claim 2, wherein the server having the light-emitting cover includes two recesses and two pogo pin connectors, the frame includes two inner side walls disposed at two sides of the opening, each of the recesses is formed on each of the inner side walls, the cover plate includes two outer side walls opposite to each other, and each of the pogo pin connectors is installed on each of the outer side walls.

4. The server having the light-emitting cover of claim 3, wherein each of the outer side walls includes a through slot, a protruding portion extends from an inner wall surface of each of the through slots, a distal end of each of the sleeve bases includes a depression portion, each of the sleeve bases is positioned in each of the through slots, and each of the protruding portions is engaged with each of the depression portions.

5. The server having the light-emitting cover of claim 4, wherein a hollow tube extends from each of the sleeve bases, each of the first through holes is formed along a central axis of each of the hollow tubes, and each of the depression portions is formed on a distal end of the hollow tube.

6. The server having the light-emitting cover of claim 3, each of the inner side walls includes a plurality of engagement slots, each of the outer side walls includes a plurality of protruding points, and each of the protruding points is detachably engaged with each of the engagement slots.

7. The server having the light-emitting cover of claim 2, wherein the light-emitting module includes a circuit board, a plurality of light-emitting diodes, and a light guide cover, the circuit board is fixed to the cover plate, the light-emitting diodes are installed on the circuit board, and the light guide cover covers the light-emitting diodes.

8. The server having the light-emitting cover of claim 7, further comprising at least one electrical connector, one end of the electrical connector being electrically connected to the axle pin through a wire, and the other end of the electrical connector being electrically inserted into the circuit board.

9. The server having the light-emitting cover of claim 7, wherein the cover plate includes a plurality of apertures, the cover plate includes an inner surface, a perpendicular plate extends from the inner surface and is disposed adjacent to the apertures, and the circuit board is fixed to the perpendicular plate.

10. The server having the light-emitting cover of claim 1, wherein the electrical contact is disposed on a bottom of the recess.

* * * * *